United States Patent [19]
Lehnen et al.

[11] Patent Number: 5,917,655
[45] Date of Patent: Jun. 29, 1999

[54] METHOD AND APPARATUS FOR GENERATING A STEREOSCOPIC IMAGE

[75] Inventors: David Charles Lehnen, Tempe, Ariz.; Marcus J. Gering, Madison, Ala.

[73] Assignee: Motorola, Inc., Schaumburg, Ill.

[21] Appl. No.: 09/055,208

[22] Filed: Apr. 6, 1998

[51] Int. Cl.$^6$ .................................................. G02B 27/10
[52] U.S. Cl. .......................... 359/625; 359/831; 359/834; 359/850; 359/857; 359/472
[58] Field of Search ..................... 359/625, 831, 359/833, 834, 837, 836, 850, 857, 866, 471, 472

[56] References Cited

U.S. PATENT DOCUMENTS

| | | | |
|---|---|---|---|
| 4,462,659 | 7/1984 | Grosser | 359/833 |
| 5,013,136 | 5/1991 | Whitehead et al. | 359/834 |
| 5,404,277 | 4/1995 | Lindblad | 362/31 |
| 5,440,391 | 8/1995 | Smeyers et al. | 356/375 |
| 5,485,318 | 1/1996 | Lebby et al. | 359/811 |
| 5,523,889 | 6/1996 | Bewsher | 359/625 |
| 5,546,888 | 8/1996 | Skiver et al. | 116/286 |
| 5,617,209 | 4/1997 | Svetkoff et al. | 356/376 |
| 5,621,547 | 4/1997 | Loiseaux et al. | 359/625 |
| 5,643,176 | 7/1997 | Persidsky | 359/831 |
| 5,654,800 | 8/1997 | Svetkoff et al. | 356/376 |
| 5,714,762 | 2/1998 | Li et al. | 250/559.2 |

*Primary Examiner*—Loha Ben
*Attorney, Agent, or Firm*—Daniel R. Collopy

[57] ABSTRACT

To generate a stereoscopic image of an object (41), two light beams (151, 161) unparallel to each other are used to back light a portion (43) of the object (41). The two light beams (151, 161) are deflected to form two deflected light beams (153, 163) substantially parallel to each other. The deflected light beams (153, 163) form a stereoscopic image of the portion (43) of the object (41). A camera (46) records the stereoscopic image of the object (41). The signal from the camera (46) is processed by a vision computer (48) to reconstruct the stereoscopic image and determine whether the object (41) meets design specifications.

20 Claims, 5 Drawing Sheets

METHOD AND APPARATUS FOR GENERATING A STEREOSCOPIC IMAGE

BACKGROUND OF THE INVENTION

The present invention relates, in general, to generating optical images and, more particularly, to generating stereoscopic images.

Typically, work pieces such as semiconductor devices are visually inspected to insure that they meet design specifications for parameters such as lead coplanarity, lead length, lead straightness, mark inspection, surface inspection, lead pitch, etc. A common approach for performing the visual inspection includes using a machine vision system to form an image of the lead in a camera. Two common techniques for providing light in machine vision systems are front lighting and back lighting techniques. A limitation of the front lighting technique is that metal leads are reflective and can cast hot spots, cold spots, or other distortions to the camera, which lead to inaccurate results being generated by the vision computer. The image of the lead formed in the camera using either front lighting or back lighting technique is usually a two dimensional image. The accurate measurement of lead parameters such as position, coplanarity, package standoff are difficult with the two dimensional image.

A laser triangulation scanning technology can be used to generate a three dimensional image of the lead, thereby facilitating the accurate measurement of lead parameters. Alternatively, two pictures of the lead having different directions of views can be formed. Each picture is a two dimensional image of the lead. A three dimensional image of the lead can be reconstructed from the two pictures. Both of these approaches are complicated and time inefficient. They also require apparatuses that are expensive. Further, the apparatuses are often too bulky to be incorporated into existing equipment such as, for example, part handlers, vision inspection systems, etc.

Accordingly, it would be advantageous to have a method and an apparatus for generating a stereoscopic image. It is desirable for the method to be simple and time efficient. It is also desirable for the apparatus to be inexpensive and small. It would be of further advantage for the apparatus to be compatible with existing equipment and inspection process.

It should be understood that for simplicity and clarity of illustration, the figures are not necessarily drawn to scale. It should also be understood that, where considered appropriate, reference numerals have been repeated among the figures to indicate corresponding or analogous elements.

DETAILED DESCRIPTION OF THE DRAWINGS

Generally, the present invention provides a method and an apparatus for generating a stereoscopic image. To generate a stereoscopic image of an object, two light beams unparallel to each other are used to back light the object. The two light beams are deflected by different angles to form two deflected light beams substantially parallel to each other. The deflected light beams form a stereoscopic image of the object. A camera records the stereoscopic image of the object. The signal from the camera is processed by a vision computer to reconstruct a three dimensional image of the object.

Figure 1:
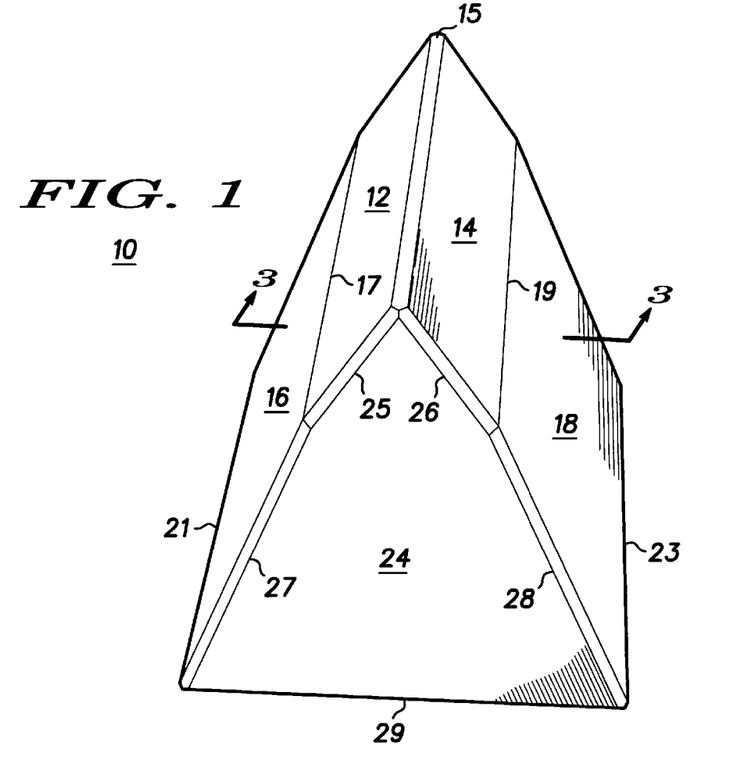
FIGS. 1 and 2 are perspective views of an optical prism that can be used for generating a stereoscopic image in accordance with a first embodiment of the present invention.
Figure 2:
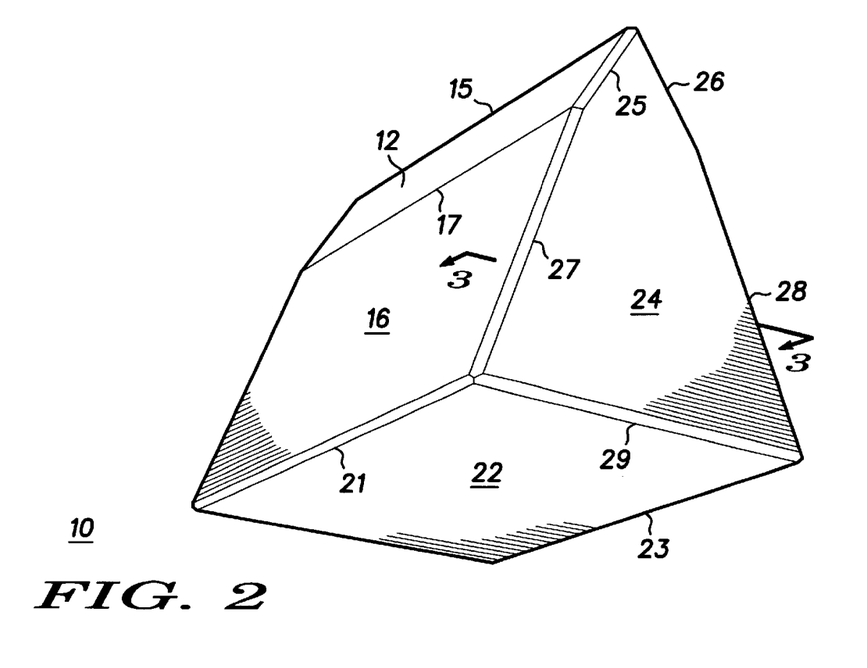

FIGS. 1 and 2 are perspective views of an optical prism 10 that can be used to deflect light beams and generate a stereoscopic image in accordance with a first embodiment of the present invention. Prism 10 has inclined surfaces 12 and 14 defining a chamfered ridge 15 therebetween. Prism 10 also has slopes 16 and 18 intersecting inclined surfaces 12 and 14, respectively. Slope 16 and inclined surface 12 define an edge 17 therebetween. Slope 18 and inclined surface 14 define an edge 19 therebetween. Further, Prism 10 has a base 22. Base 22 and slope 16 define a chamfered edge 21 therebetween. Base 22 and slope 18 define a chamfered edge 23 therebetween. Ridge 15 and edges 17, 19, 21, and 23 are preferably substantially parallel to each other.

Prism 10 also has two end surfaces substantially parallel to each other and substantially perpendicular to inclined surfaces 12 and 14, slopes 16 and 18, and base 22. FIGS. 1 and 2 only show one of the two end surfaces, i.e., end surface 24. End surface 24 and inclined surface 12 define a chamfered edge 25 therebetween. End surface 24 and inclined surface 14 define a chamfered edge 26 therebetween. End surface 24 and slope 16 define a chamfered edge 27 therebetween. End surface 24 and slope 18 define a chamfered edge 28 therebetween. End surface 24 and base 22 define a chamfered edge 29 therebetween. Likewise, the other end surface (not shown) of prism 10 define five chamfered edges with inclined surfaces 12 and 14, slopes 16 and 18, and base 22.

Ridge 15 and the selected edges, e.g., edges 21, 23, 25, 26, 27, 28, and 29, of prism 10 are chamfered to prevent chipping to prism 10 and provide additional support positions on prism 10. However, these features are optional. In other words, ridge 15 and the selected edges, e.g., edges 21, 23, 25, 26, 27, 28, and 29, do not need to be chamfered.

Figure 3:
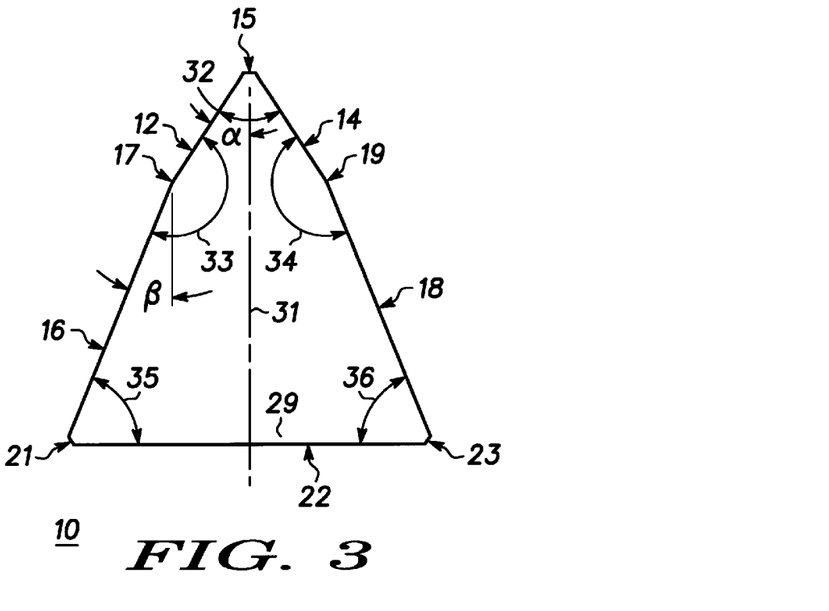
FIG. 3 is a cross-sectional view of the optical prism of FIGS. 1 and 2 along a cross-sectional plane 3—3.

FIG. 3 is a cross-sectional view of prism 10 along a cross sectional plane 3—3 of FIGS. 1 and 2. FIG. 3 shows that inclined surfaces 12 and 14, slopes 16 and 18, and base 22 form a pentagonal cross section of prism 10. The pentagon is substantially symmetric with respect to a plane 31 passing through ridge 15 and substantially perpendicular to base 22. It should be noted that FIG. 3 only shows an edge of plane 31. The pentagon has five internal angles, which are internal angle 32 defined by inclined surfaces 12 and 14 at ridge 15, internal angle 33 defined by inclined surface 12 and slope 16 at edge 17, internal angle 34 defined by inclined surface 14 and slope 18 at edge 19, internal angle 35 defined by slope 16 and base 22 at edge 21, and internal angle 36 defined by slope 18 and base 22 at edge 23. Internal angles 33 and 34 are substantially equal to each other. Internal angles 35 and 36 are substantially equal to each other. The sum of all five internal angles of the pentagon is 540 degrees (°).

The shape of prism 10 depends on the optical properties, e.g., refractive index, of the material of which prism 10 is made. The shape of prism 10 is conventionally described by specifying the values of two angles. The first angle is between inclined surface 12 and plane 31 and referred to as α in FIG. 3. The second angle is between slope 16 and a plane parallel to plane 31 and referred to as β in FIG. 3. As shown in FIG. 3, internal angle 32 is substantially equal to 2α, internal angles 33 and 34 are substantially equal to 180°−(α−β), and internal angles 35 and 36 are substantially equal to 90°−β. Generally, α is between approximately 20° and approximately 40° and β is between approximately 10° and approximately 30°. Accordingly, internal angle 32 is between approximately 40° and approximately 80°, and internal angles 35 and 36 are between approximately 60° and approximately 80°. In an embodiment, prism 10 is made of a glass material having a refractive index of approximately 1.5. In the embodiment, α is equal to approximately 33°, and β is equal to approximately 22°. Accordingly, internal angle 32 is equal to approximately 66°, internal angle 33 and 34 are equal to approximately 169°, and internal angle 35 and 36 are equal to approximately 68°.

The size of prism 10 depends on the application. Preferably, prism 10 is sufficiently small to be easily installed in a vision inspection station. On the other hand, a larger prism allows more light transmitting therethrough and, therefore, generates images having larger fields of views. After the shape of prism 10 is determined, the size of prism 10 can be characterized by its height, width, and length. The height of prism 10 is defined as the distance between ridge 15 and base 22. The width of prism 10 is defined as the length of edge 29. The length of prism 10 is defined as the length of ridge 15. By way of example, in an application that uses prism 10 in a vision inspection station to inspect the leads of an electronic device, prism 10 has a height between approximately 4 millimeters (mm) and approximately 6 mm, a width between approximately 4 mm and approximately 6 mm, and a length between approximately 5 mm and approximately 7 mm.

When using prism 10 to deflect light beams and generate a stereoscopic image in accordance with the present invention, light beams are transmitted into prism 10 by refraction through either inclined surface 12 or inclined surface 14. The light beams transmitted into prism 10 via refractive surface 12 are reflected by either inclined surface 14 or slope 18 before being transmitted out of prism 10 via base 22. Likewise, the light beams transmitted into prism 10 via refractive surface 14 are reflected by either inclined surface 12 or slope 16 before being transmitted out of prism 10 via base 22. Therefore, inclined surfaces 12 and 14 are also referred to as refractive surfaces, and slopes 16 and 18 are also referred to as reflective surfaces. Refractive surfaces 12 and 14, reflective surfaces 16 and 18, and base 22 are working optical surfaces. They are preferably optically polished. By way of example, refractive surfaces 12 and 14, reflective surfaces 16 and 18, and base 22 are polished to a flatness of approximately 50 nanometers (nm) and to a smoothness of approximately 20 nm. Chamfered ridge 15, the chamfered edges, and the two end surfaces do not need to be optically polished because the light beams that form the stereoscopic image do not transmit therethrough. By way of example, they are ground to a flatness of approximately 15 micrometers (μm).

Prism 10 can be made of any transparent optical material such as, for example, glass, plastic, synthetic corundum, cubic zirconia, diamond, yttrium aluminum garnet, or the like. Preferably, the material of prism 10 is optically clear to light in the frequency range being used, such as visible light, infrared radiation, ultraviolet radiation, etc. The material of prism 10 also preferably has a reasonably high mechanical hardness so that prism 10 is resistant to scratching. Optically transparent materials having a refractive index greater than approximately 1.5 and a mechanical hardness greater than approximately 6 on Mohs' scale are suitable for prism 10.

Figure 4:
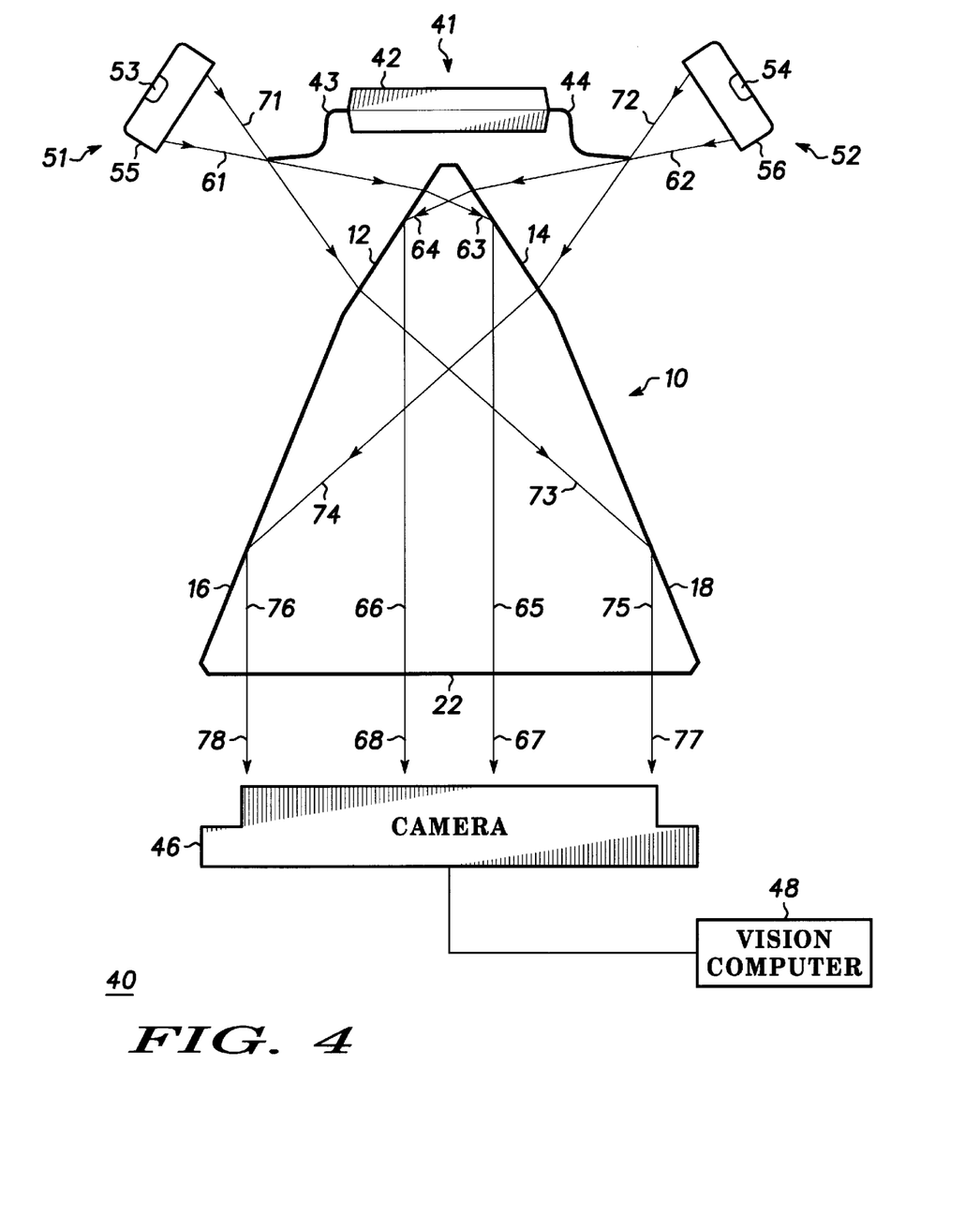
FIG. 4 schematically illustrates an optical apparatus that uses the optical prism of FIGS. 1–3 for generating a stereoscopic image in accordance with the present invention.

FIG. 4 schematically illustrates an optical apparatus 40 for generating a stereoscopic image in accordance with the present invention. It should be noted that FIG. 4 only shows those features of apparatus 40 which are relevant to its optical operation. Apparatus 40 includes optical prism 10 of FIGS. 1–3 and FIG. 4 shows a cross-sectional view of optical prism 10. Apparatus 40 is used to inspect a work piece such as, for example, a packaged semiconductor device 41 placed over optical prism 10. By way of example, semiconductor device 41 is a two-sided surface mount integrated circuit device that includes a body 42 and two sets of leads, e.g., sets of leads 43 and 44, on the opposite sides of body 42. Only one lead in each set of leads 43 and 44 is shown in FIG. 4. Apparatus 40 forms two images for each set of leads 43 and 44 in a camera 46 facing base 22 of prism 10. A vision computer 48 coupled to camera 46 processes the images in camera 46 and reconstructs stereoscopic or three dimensional images of sets of leads 43 and 44. Light sources 51 and 52 are used to illuminate two portions of device 41. More particularly, light source 51 is used to back light set of leads 43, and light source 52 is used to back light set of leads 44. By way of example, light sources 51 and 52 are diffusive light sources. Light source 51 includes a light emitting diode (LED) 53 mounted in a translucent light diffuser 55. Likewise, light source 52 includes an LED 54 mounted in a translucent light diffuser 56. Translucent light diffusers 55 and 56 are made of a diffusing translucent material such as, for example, an acetal plastic material sold under the trademark DELRIN. Apparatus 40 is sometimes also referred to as a stereoscopic image apparatus, a vision lead inspection station, or a machine vision system.

In operation, LEDs 53 and 54 emit diffusive light via light diffuser 55 and 56, respectively. Diffusive light includes light beams in different directions. Some light beams propagating toward prism 10 generate silhouettes of sets of leads 43 and 44.

A light beam, referred to as an incident beam 61, in the diffusive light emitted by light source 51 propagates toward set of leads 43 and refractive surface 12 of prism 10. Incident beam 61 illuminates set of leads 43 and generates a silhouette thereof. Refractive surface 12 refracts incident beam 61, thereby generating a refracted beam 63 in prism 10 and propagating toward refractive surface 14. Refractive surface 14 generates a deflected beam 65 substantially perpendicular to base 22 by reflecting refracted beam 63. Deflected beam 65 transmits out of prism 10 via base 22. More particularly, base 22 refracts deflected beam 65 to generate an image beam 67. Because deflected beam 65 is substantially perpendicular to base 22, image beam 67 is substantially in the same direction as deflected beam 65.

Another light beam, referred to as an incident beam 71, in the diffusive light emitted by light source 51 propagates toward set of leads 43 and refractive surface 12 of prism 10. Incident beam 71 illuminates set of leads 43 and generates a silhouette thereof. Incident beam 71 is in a direction slightly different from that of incident beam 61. Therefore, the silhouette of set of leads 43 generated by incident beam 71 has a different angle of view from that generated by incident beam 61. Refractive surface 12 refracts incident beam 71, thereby generating a refracted beam 73 in prism 10 and propagating toward reflective surface 18. Reflective surface 18 generates a deflected beam 75 substantially parallel to reflected beam 65 by reflecting refracted beam 73. Deflected beam 75 transmits out of prism 10 via base 22.

More particularly, base 22 refracts deflected beam 75 to generate an image beam 77. Because, like deflected beam 65, deflected beam 75 is substantially perpendicular to base 22, image beam 77 is substantially in the same direction as deflected beam 75.

A light beam, referred to as an incident beam 62, in the diffusive light emitted by light source 52 propagates toward set of leads 44 and refractive surface 14 of prism 10. Incident beam 62 illuminates set of leads 44 and generates a silhouette thereof. Refractive surface 14 refracts incident beam 62, thereby generating a refracted beam 64 in prism 10 and propagating toward refractive surface 12. Refractive surface 12 generates a deflected beam 66 substantially parallel to deflected beam 65 by reflecting refracted beam 64. Deflected beam 66 transmits out of prism 10 via base 22. More particularly, base 22 refracts deflected beam 66 to generate an image beam 68. Because, like deflected beam 65, deflected beam 66 is substantially perpendicular to base 22, image beam 68 is substantially in the same direction as deflected beam 66.

Another light beam, referred to as an incident beam 72, in the diffusive light emitted by light source 52 propagates toward set of leads 44 and refractive surface 14 of prism 10. Incident beam 72 illuminates set of leads 44 and generates a silhouette thereof. Incident beam 72 is in a direction slightly different from that of incident beam 62. Therefore, the silhouette of set of leads 44 generated by incident beam 72 has a different angle of view from that generated by incident beam 62. Refractive surface 14 refracts incident beam 72, thereby generating a refracted beam 74 in prism 10 and propagating toward reflective surface 16. Reflective surface 16 generates a deflected beam 76 substantially parallel to reflected beam 66 by reflecting refracted beam 74. Deflected beam 76 transmits out of prism 10 via base 22. More particularly, base 22 refracts deflected beam 76 to generate an image beam 78. Because, like deflected beam 66, deflected beam 76 is substantially perpendicular to base 22, image beam 78 is substantially in the same direction as deflected beam 75.

Camera 46 receives image beams 67, 77, 68, and 78. Image beams 67 and 77 form two images of sets of leads 43 in camera 46. The image formed by image beam 67 has a different angle of view from that formed by image beam 77. Sometimes, the image formed by image beam 67 is referred to as a shallow view image of sets of leads 43, and the image formed by image beam 77 is referred to as a steep view image of sets of leads 43. Image beams 68 and 78 form two images of sets of leads 44 in camera 46. The image formed by image beam 68 has a different angle of view from that formed by image beam 78. Sometimes, the image formed by image beam 68 is referred to as a shallow view image of sets of leads 44, and the image formed by image beam 78 is referred to as a steep view image of sets of leads 44.

Light beams emitted by light sources 51 and 52 in directions different from those of incident beams 61, 71, 62, and 72 are either blocked by some light blocking elements (not shown) of apparatus 40 or deflected by prism 10 into directions different from that of image beams 67, 77, 68, and 78. Therefore, those light beams do not reach camera 46 and do not affect the operation of apparatus 40.

Using the four images formed in camera 46, vision computer 48 reconstructs stereoscopic images of sets of leads 43 and 44. Further, vision computer 48 measures the lead parameters, e.g., lead tip position, lead coplanarity, lead length, lead straightness, lead pitch, etc., of sets of leads 43 and 44. If either set of leads 43 or 44 does not meet a predetermined design specification, semiconductor device 41 is rejected.

It should be understood that the structure of apparatus 40 is not limited to that described hereinbefore. For example, if apparatus 40 is used to inspect the leads on only one side of a device body, apparatus 40 only needs one light source, e.g., light source 51. Even if a packaged device, e.g., device 41, has leads on more than one side of its body, an apparatus having only one light source, e.g., light source 51, can be used to inspect all leads of the package device by inspecting different sides of the device sequentially. LEDs 53 and 54 can be replaced by any kind of light emitting devices such as, for example, light bulbs. Light sources 51 and 52 are not limited to diffusive light sources. Each of light sources 51 and 52 can be replaced by any kind of device that generates at least two light beams having slightly different directions from each other. In addition, deflected beams 65, 75, 66, and 76 in prism 10 are not limited to being perpendicular to base 22. Therefore, base 22 of prism 10 is not limited to perpendicular to plane 31 as shown in FIG. 3. If deflected beams 65, 75, 66, and 76 are oblique to base 22, image beams 67, 77, 68, and 78 will be in a direction different from that of deflected beams 65, 75, 66, and 76. As long as deflected beams 65, 75, 66, and 76 are substantially parallel to each other, image beams 67, 77, 68, and 78 will be substantially parallel to each other and the stereoscopic images of sets of leads 43 and 44 can be formed in a single camera, e.g., camera 46. However, the location and orientation of camera 46 may need to be adjusted to receive image beams 67, 77, 68, and 78 if deflected beams 65, 75, 66, and 76 are not perpendicular to base 22.

Figure 5:
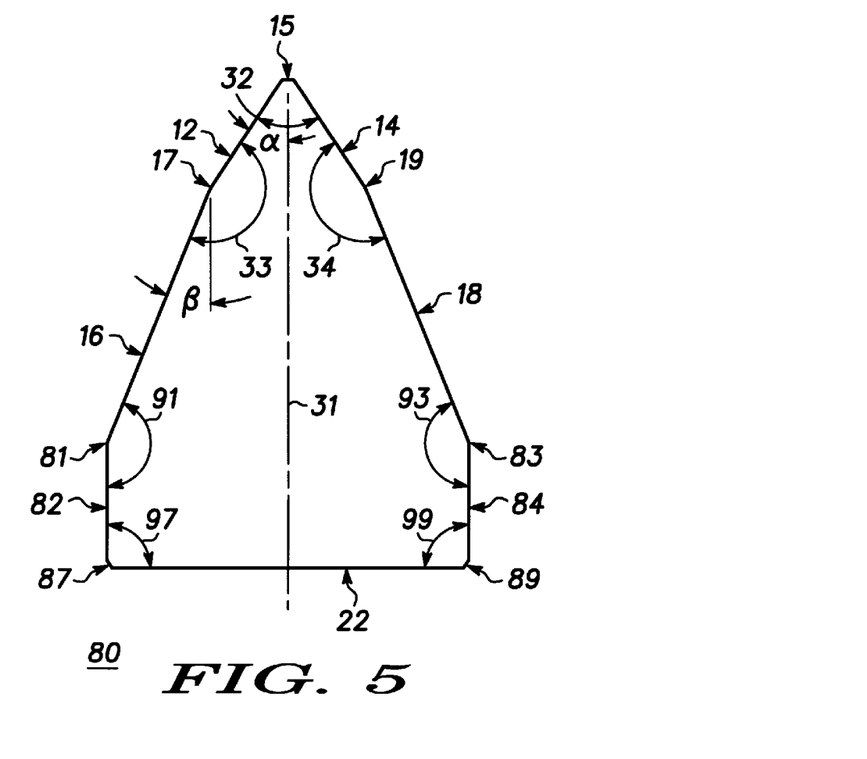
FIG. 5 is a cross-sectional view of an optical prism that can be used for generating a stereoscopic image in accordance with a second embodiment of the present invention.

FIG. 5 is a cross-sectional view of an optical prism 80 that can be used for generating a stereoscopic image in accordance with a second embodiment of the present invention. Like prism 10 of FIGS. 1–3, prism 80 has inclined surfaces 12 and 14 defining a chamfered ridge 15 therebetween. Prism 80 also has slopes 16 and 18 intersecting inclined surfaces 12 and 14, respectively. Slope 16 and inclined surface 12 define an edge 17 therebetween. Slope 18 and inclined surface 14 define an edge 19 therebetween. Further, Prism 80 also has a base 22. A difference between the structure of prism 80 and that of prism 10 shown in FIGS. 1–3 is that prism 80 has a side 82 coupled between slope 16 and base 22 and a side 84 coupled between slope 18 and base 22. Sides 82 and 84 are substantially parallel to each other and substantially perpendicular to base 22. Side 82 and slope 16 intersect each other and define an edge 81 therebetween. Side 84 and slope 18 intersect each other and define an edge 83 therebetween. Side 82 and base 22 intersect each other and define an edge 87 therebetween. Side 84 and base 22 intersect each other and define an edge 89 therebetween. Ridge 15 and edges 17, 19, 81, 83, 87, and 89 are substantially parallel to each other. Like prism 10 of FIGS. 1–3, prism 80 also has two end surfaces (not shown) substantially parallel to each other and substantially perpendicular to inclined surfaces 12 and 14, slopes 16 and 18, sides 82, and 84, and base 22. Ridge 15 and some edges, e.g., edges 87 and 89, of prism 80 are chamfered to prevent chipping to prism 80 and provide additional support positions on prism 80. However, these features are optional. In other words, ridge 15 and edges 87 and 89, do not need to be chamfered.

Inclined surfaces 12 and 14, slopes 16 and 18, sides 82 and 84, and base 22 of prism 80 form a heptagonal cross section of prism 80. The heptagon is substantially symmetric with respect to a plane 31 passing through ridge 15 and substantially perpendicular to base 22. It should be noted that FIG. 5 only shows an edge of plane 31. The heptagon has seven internal angles, which are internal angle 32 defined by inclined surfaces 12 and 14 at ridge 15, internal angle 33 defined by inclined surface 12 and slope 16 at edge 17, internal angle 34 defined by inclined surface 14 and slope 18 at edge 19, internal angle 91 defined by slope 16 and side 82 at edge 81, internal angle 93 defined by slope 18 and side 84 at edge 83, internal angle 97 defined by side 82 and base 22 at edge 87, and internal angle 99 defined by side 84 and base 22 at edge 89. Internal angles 33 and 34 are substantially equal to each other. Internal angles 91 and 93 are substantially equal to each other. Internal angles 97 and 99 are substantially equal to each other. The sum of all seven internal angles of the heptagon is 900°. It should be noted that prism 80 is not limited to being a symmetric heptagon. More particularly, base 22 of prism 80 is not limited to being perpendicular to plane 31.

The shape of prism 80 is conventionally described by specifying the values of two angles. The first angle is between inclined surface 12 and plane 31 and referred to as $\alpha$ in FIG. 5. The second angle is between slope 16 and a plane parallel to plane 31 and referred to as $\beta$ in FIG. 5. As shown in FIG. 5, internal angle 32 is substantially equal to $2\alpha$, internal angles 33 and 34 are substantially equal to $180°-(\alpha-\beta)$, internal angles 91 and 93 are substantially equal to $180°-\beta$, and internal angles 97 and 99 are substantially equal to 90°. After the shape of prism 80 is determined, the size of prism 80 is characterized by its height, width, and length. The height of prism 80 is defined as the distance between ridge. 15 and base 22. The width of prism 80 is defined as the distance between sides 82 and 84. The length of prism 80 is defined as the length of ridge 15.

Prism 80 can be made of any transparent optical material that is suitable for prism 10. The optical characteristics of prism 80 are similar to those of prism 10. Sides 82 and 84 serves to adjust the height of prism 80 without changing the width of prism 80. Generally in prism 80, $\alpha$ is between approximately 20° and approximately 40° and $\beta$ is between approximately 10° and approximately 30°. Accordingly, internal angle 32 is between approximately 40° and approximately 80°, and internal angles 91 an 93 are between approximately 150° and approximately 170°. In an embodiment, prism 80 is made of a glass material having a refractive index of approximately 1.5. In the embodiment, $\alpha$ is equal to approximately 33°, and $\beta$ is equal to approximately 22°. Accordingly, internal angle 32 is equal to approximately 66°, internal angle 33 and 34 are equal to approximately 169°, and internal angle 91 and 93 are equal to approximately 158°.

Inclined surfaces 12 and 14 are also referred to as refractive surfaces. Slopes 16 and 18 are also referred to as reflective surfaces. Refractive surfaces 12 and 14, reflective surfaces 16 and 18, and base 22 are working optical surfaces. They are preferably optically polished. Sides 82 and 84, and the two end surfaces of prism 80 do not need to be optically polished because the light beams that form the stereoscopic image do not transmit therethrough.

Figure 6:
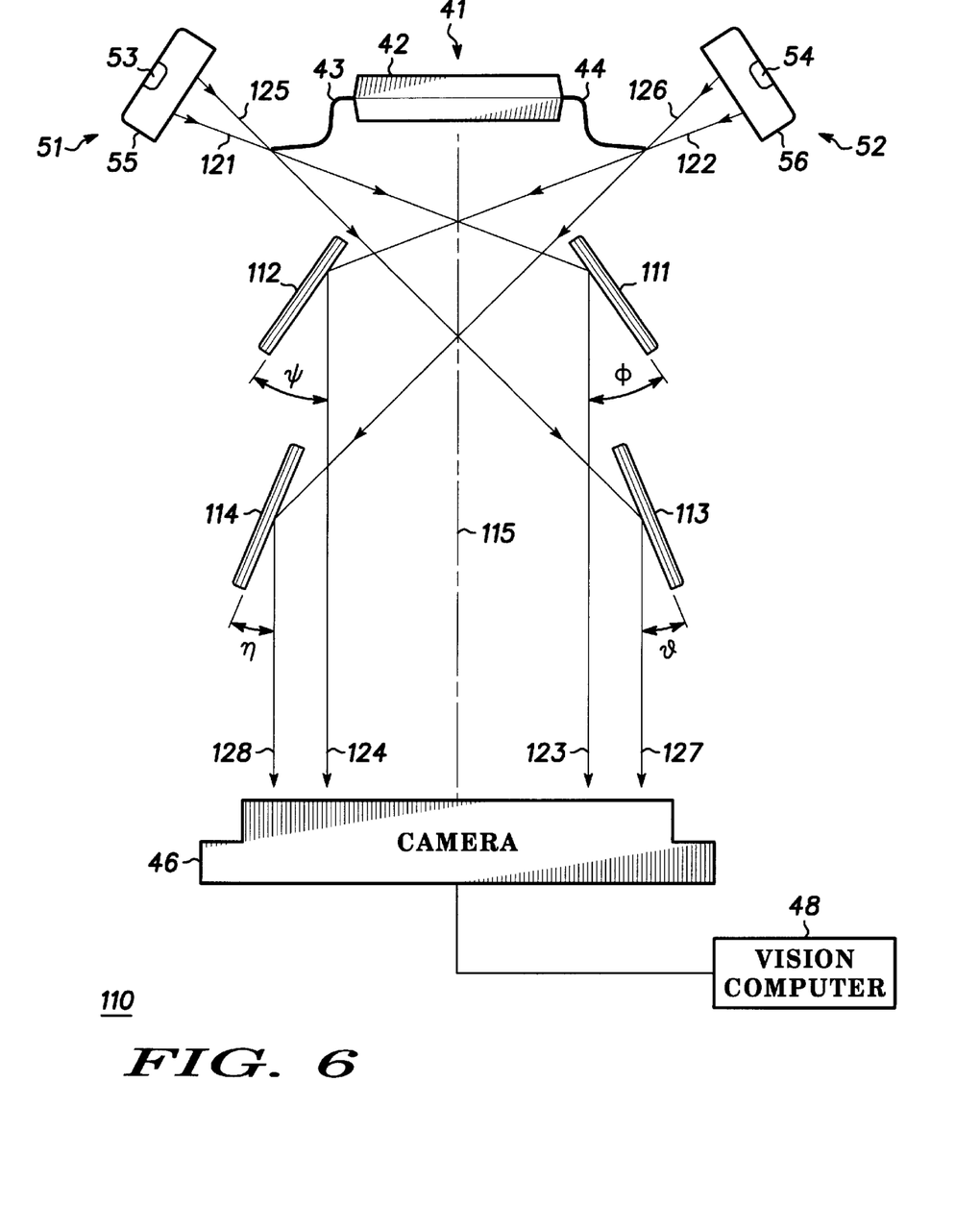
FIG. 6 schematically illustrates an optical apparatus for generating a stereoscopic image in accordance with a third embodiment of the present invention.

FIG. 6 schematically illustrates an optical apparatus 110 for generating a stereoscopic image in accordance with a third embodiment of the present invention. It should be noted that FIG. 6 only shows those features of apparatus 110 which are relevant to its optical operation. Apparatus 110 is used to inspect a work piece such as, for example, a packaged semiconductor device 41 that includes a body 42 and two sets of leads, e.g., sets of leads 43 and 44, on the opposite sides of body 42. Apparatus 110 forms two images for each set of leads 43 and 44 in a camera 46. A vision computer 48 coupled to camera 46 processes the images in camera 46 and reconstructs stereoscopic or three dimensional images of sets of leads 43 and 44. Light sources 51 and 52 are used to illuminate two portions of device 41. More particularly, light source 51 is used to back light set of leads 43, and light source 52 is used to back light set of leads 44. Light source 51 includes an LED 53 mounted in a translucent light diffuser 55. Likewise, light source 52 includes an LED 54 mounted in a translucent light diffuser 56. Apparatus 110 is sometimes also referred to as a stereoscopic image apparatus, a vision lead inspection station, or a machine vision system.

Apparatus 110 includes four mirrors serving as reflected surfaces or reflectors. Mirrors 111 and 112 are positioned opposite to each other. Preferably, the positions and orientations of mirrors 111 and 112 are substantially symmetric with respect to a plane 115 shown in FIG. 6. It should be noted that FIG. 6 only shows an edge of plane 115. Mirrors 113 and 114 are positioned opposite to each other and adjacent to mirrors 111 and 112, respectively. Preferably, the positions and orientations of mirrors 113 and 114 are substantially symmetric with respect to plane 115. The orientation of mirror 111 is represented by an angle, referred to as $\phi$ in FIG. 6, between mirror 111 and a plane parallel to plane 115. The orientation of mirror 112 is represented by an angle, referred to as $\psi$ in FIG. 6, between mirror 112 and a plane parallel to plane 115. The orientation of mirror 113 is represented by an angle, referred to as $\theta$ in FIG. 6, between mirror 113 and a plane parallel to plane 115. The orientation of mirror 114 is represented by an angle, referred to as $\eta$ in FIG. 6, between mirror 114 and a plane parallel to plane 115. Accordingly, $\psi$ is approximately equal to $\phi$, and $\eta$ is approximately equal to $\theta$.

The positions, sizes, and orientations of mirrors 111, 112, 113, and 114 depend on the application. Preferably, mirrors 111, 112, 113, and 114 are sufficiently small and closely positioned to each other so that they can be easily installed in a vision inspection station. On the other hand, larger mirrors have larger fields of views. By way of example, mirrors 111, 112, 113, and 114 are rectangular front-surface mirrors having a thickness between approximately 0.5 mm and approximately 2 mm, a length between approximately 5 mm and approximately 30 mm, and a width between approximately 5 mm and approximately 20 mm. It should be noted that the width of mirrors 111, 112, 113, and 114 are the dimensions of respective mirrors in a direction perpendicular to the drawing of FIG. 6. It should also be noted that mirrors 111, 112, 113, and 114 can have different shapes and sizes from each other. The orientations of mirrors 111, 112, 113, and 114 further depend on the positions of light sources 51 and 52. More particularly, mirrors 111, 112, 113, and 114 are preferably so oriented that camera 46 can receive stereoscopic images of sets of leads 43 and 44 formed by mirrors 111, 112, 113, and 114. By way of example, $\phi$ and $\psi$ are between approximately 30° and approximately 80°, and $\theta$ and $\eta$ are between approximately 20° and approximately 75°. In some applications, the back sides of mirrors 113 and 114 are ground at an angle (not shown) so that mirrors 113 and 114 can be positioned very closely to mirrors 111 and 112, respectively.

In operation, LEDs 53 and 54 emit diffusive light via light diffuser 55 and 56, respectively. Diffusive light includes light beams in different directions. Some light beams propagate toward mirrors 111, 112, 113, and 114 and generate silhouettes of sets of leads 43 and 44.

A light beam, referred to as an incident beam 121, in the diffusive light emitted by light source 51 propagates toward set of leads 43 and mirror 111. Incident beam 121 illuminates set of leads 43 and generates a silhouette thereof. Mirror 111 reflects incident beam 121 and generates a reflected beam 123 in a reflected direction substantially parallel to plane 115. Another light beam, referred to as an incident beam 125, in the diffusive light emitted by light source 51 has an incident direction different from that of incident beam 121 and propagates toward set of leads 43 and mirror 113. Incident beam 125 illuminates set of leads 43 and generates a silhouette thereof. Mirror 113 reflects incident beam 125 and generates a reflected beam 127 substantially parallel to reflected beam 123. A light beam, referred to as an incident beam 122, in the diffusive light emitted by light source 52 propagates toward set of leads 44 and mirror 112. Incident beam 122 illuminates set of leads 44 and generates a silhouette thereof. Mirror 112 reflects incident beam 122 and generates a reflected beam 124 substantially parallel to reflected beam 123. Another light beam, referred to as an incident beam 126, in the diffusive light emitted by light source 52 has an incident direction different from that of incident beam 122 and propagates toward set of leads 44 and mirror 114. Incident beam 126 illuminates set of leads 44 and generates a silhouette thereof. Mirror 114 reflects incident beam 126 and generates a reflected beam 128 substantially parallel to reflected beam 124. Reflected beams 123, 127, 124, and 128 are also referred to as a deflected beams.

Camera 46 receives reflected beams 123, 127, 124, and 128. Reflected beams 123 and 127 form two images of sets of leads 43 in camera 46. The image formed by reflected beam 123 has a different angle of view from that formed by reflected beam 127. Sometimes, the images formed by reflected beams 123 and 127 are referred to as a shallow view image and a steep view image, respectively, of sets of leads 43. Reflected beams 124 and 128 form two images of sets of leads 44 in camera 46. The image formed by reflected beam 124 has a different angle of view from that formed by reflected beam 128. Sometimes, the images formed by reflected beams 124 and 128 are referred to as a shallow view image and a steep view image, respectively, of sets of leads 44.

Light beams emitted by light sources 51 and 52 in directions different from those of incident beams 121, 125, 122, and 126 are either blocked by some light blocking elements (not shown) of apparatus 110 or reflected by mirrors 111, 112, 113, and 114 into directions different from that of reflected beams 123, 127, 124, and 128. Therefore, those light beams do not reach camera 46 and do not affect the images formed therein.

Using the four images formed in camera 46, vision computer 48 reconstructs stereoscopic images of sets of leads 43 and 44. Further, vision computer 48 measures the lead parameters, e.g., lead tip position, lead coplanarity, lead length, lead straightness, lead pitch, etc., of sets of leads 43 and 44. If either set of leads 43 or 44 does not satisfy a predetermined design specification, semiconductor device 41 is rejected.

It should be understood that the structure of apparatus 110 is not limited to that described hereinbefore. For example, if apparatus 110 is used to inspect the leads on only one side of a device body, apparatus 110 only needs one light source, e.g., light source 51, and two mirrors, e.g., mirrors 111 and 113. Even if a packaged device, e.g., device 41, has leads on more than one side of its body, an apparatus having only one light source, e.g., light source 51, and two mirrors, e.g., mirrors 111 and 113, can be used to inspect all leads of the package device by inspecting one side at a time. LEDs 53 and 54 can be replaced by any kind of light emitting devices such as, for example, light bulbs. Each of light sources 51 and 52 can be replaced by any kind of device that generates at least two collinear light beams having slightly different directions from each other. In addition, reflected beams 123, 127, 124, and 128 are not limited to being parallel to plane 115. Accordingly, with respect to plane 115, mirrors 111 and 112 are not limited to being symmetric to each other, and mirrors 113 and 114 are not limited to being symmetric to each other. As long as reflected beams 123, 127, 124, and 128 are substantially parallel to each other, the stereoscopic images of sets of leads 43 and 44 can be formed in a single camera, e.g., camera 46. However, the location and orientation of camera 46 may need to be adjusted to receive reflected beams 123, 127, 124, and 128 if they are not parallel to plane 115.

Figure 7:
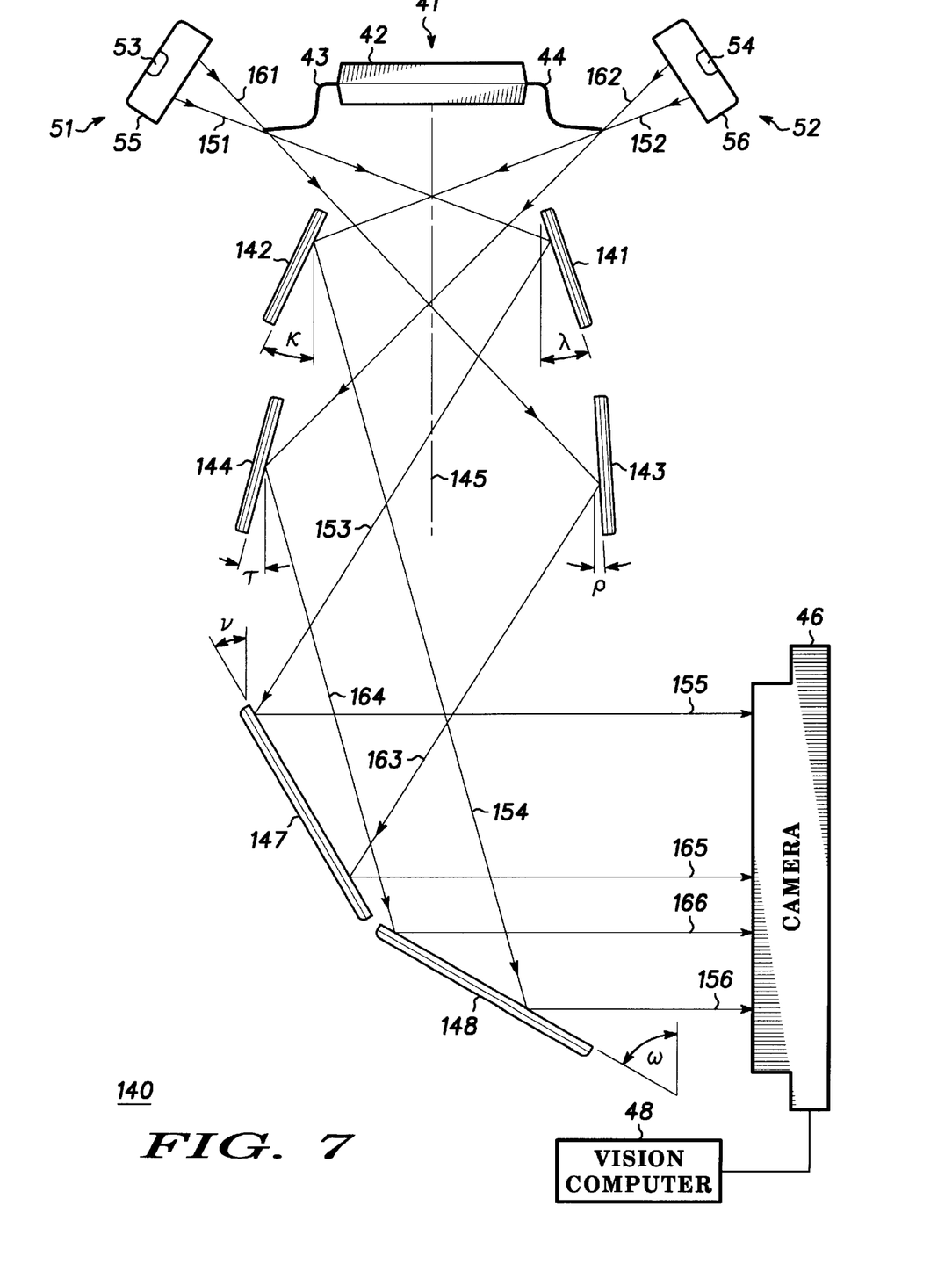
FIG. 7 schematically illustrates an optical apparatus for generating a stereoscopic image in accordance with a fourth embodiment of the present invention.

FIG. 7 schematically illustrates an optical apparatus 140 for generating a stereoscopic image in accordance with a fourth embodiment of the present invention. It should be noted that FIG. 7 only shows those features of apparatus 140 which are relevant to its optical operation. Apparatus 140 is used to inspect a work piece such as, for example, a packaged semiconductor device 41 that includes a body 42 and two sets of leads, e.g., sets of leads 43 and 44, on the opposite sides of body 42. Apparatus 140 forms two images for each set of leads 43 and 44 in a camera 46. A vision computer 48 coupled to camera 46 processes the images in camera 46 and reconstructs stereoscopic or three dimensional images of sets of leads 43 and 44. Light sources 51 and 52 are used to illuminate two portions of device 41. More particularly, light source 51 is used to back light set of leads 43, and light source 52 is used to back light set of leads 44. Light source 51 includes an LED 53 mounted in a translucent light diffuser 55. Likewise, light source 52 includes an LED 54 mounted in a translucent light diffuser 56. Apparatus 140 is sometimes also referred to as a stereoscopic image apparatus, a vision lead inspection station, or a machine vision system.

Apparatus 140 includes six mirrors. A mirror 141 and a mirror 142 are positioned opposite to each other. A mirror 143 and a mirror 144 are positioned opposite to each other and adjacent to mirrors 141 and 142, respectively. Mirrors 141, 142, 143, and 144 are also referred to as reflective surfaces or reflectors. A base mirror 147 is positioned to receive light beams reflected from mirrors 141 and 143. Likewise, a base mirror 148 is positioned to receive light beams reflected from mirrors 142 and 144. Base mirrors 147 and 148 are also referred to as base reflective surfaces or base reflectors. The orientation of mirror 141 is characterized by an angle, referred to as $\lambda$ in FIG. 7, between mirror 141 and a plane 145 shown in FIG. 7. It should be noted that FIG. 7 only shows an edge of plane 145. The orientation of mirror 142 is characterized by an angle, referred to as $\kappa$ in FIG. 7, between mirror 142 and plane 145. The orientation of mirror 143 is characterized by an angle, referred to as $\rho$ in FIG. 7, between mirror 143 and plane 145. The orientation of mirror 144 is characterized by an angle, referred to as $\tau$ in FIG. 7, between mirror 144 and plane 145. The orientation of base mirror 147 is characterized by an angle, referred to as $\nu$ in FIG. 7, between base mirror 147 and plane 145. The orientation of base mirror 148 is characterized by an angle, referred to as $\omega$ in FIG. 7, between base mirror 148 and plane 145. In a preferred embodiment, mirrors 141 and 142 are substantially symmetric to each other with respect to plane 145, and mirrors 143 and 144 are substantially symmetric to each other with respect to plane 145. Therefore, $\lambda$ and $\kappa$ are preferably substantially equal to each other, and $\rho$ and $\nu$ are preferably substantially equal to each other.

The positions, sizes, and orientations of mirrors 141, 142, 143, 144, 147, and 148 depend on the application.

Preferably, mirrors 141, 142, 143, 144, 147, and 148 are sufficiently small and closely positioned to each other so that they can be easily installed in a vision inspection station. On the other hand, larger mirrors have larger fields of views. By way of example, mirrors 141, 142, 143, 144, 147, and 148 are rectangular front-surface mirrors having a thickness between approximately 0.5 mm and approximately 2 mm, a length between approximately 5 mm and approximately 30 mm, and a width between approximately 5 mm and approximately 20 mm. It should be noted that the width of mirrors 141, 142, 143, 144, 147, and 148 are the dimensions of respective mirrors in a direction perpendicular to the drawing of FIG. 7. It should also be noted that mirrors 141, 142, 143, 144, 147, and 148 can have different shapes and sizes from each other. The orientations of mirrors 141, 142, 143, 144, 147, and 148 further depend on the positions of light sources 51 and 52. More particularly, mirrors 141, 142, 143, 144, 147, and 148 are preferably so oriented that camera 46 can receive stereoscopic images of sets of leads 43 and 44 formed by mirrors 141, 142, 143, 144, 147, and 148. By way of example, $\lambda$ and $\kappa$ are between approximately 30° and approximately 80°, $\rho$ and $\tau$ are between approximately 20° and approximately 75°, $\nu$ is between approximately 30° and approximately 75°, and $\omega$ is between approximately 20° and approximately 60°. In some applications, the back sides of mirrors 143 and 144 are ground at an angle (not shown) so that mirrors 143 and 144 can be positioned very closely to mirrors 141 and 142, respectively.

In operation, LEDs 53 and 54 emit diffusive light via light diffuser 55 and 56, respectively. Diffusive light includes light beams in different directions. Some light beams propagate toward mirrors 141, 142, 143, and 144 and generate silhouettes of sets of leads 43 and 44.

A light beam, referred to as an incident beam 151, in the diffusive light emitted by light source 51 propagates toward set of leads 43 and mirror 141. Incident beam 151 illuminates set of leads 43 and generates a silhouette thereof. Mirror 141 reflects incident beam 151 and generates a deflected beam 153 propagating toward base mirror 147. Base mirror 147 reflects deflected beam 153 and generates an image beam 155. Another light beam, referred to as an incident beam 161, in the diffusive light emitted by light source 51 propagates toward set of leads 43 and mirror 143 in a direction different from that of incident beam 151. Incident beam 161 illuminates set of leads 43 and generates a silhouette thereof. Mirror 143 reflects incident beam 161 and generates a deflected beam 163 substantially parallel to deflected beam 153 and propagating toward base mirror 147. Base mirror 147 reflects deflected beam 163 and generates an image beam 165 substantially parallel to image beam 155. A light beam, referred to as an incident beam 152, in the diffusive light emitted by light source 52 propagates toward set of leads 44 and mirror 142. Incident beam 152 illuminates set of leads 44 and generates a silhouette thereof. Mirror 142 reflects incident beam 152 and generates a deflected beam 154 propagating toward base mirror 148. Base mirror 148 reflects deflected beam 154 and generates an image beam 156 substantially parallel to image beam 155. Another light beam, referred to as an incident beam 162, in the diffusive light emitted by light source 52 propagates toward set of leads 44 and mirror 144 in a direction different from that of incident beam 161. Incident beam 162 illuminates set of leads 44 and generates a silhouette thereof. Mirror 144 reflects incident beam 162 and generates a deflected beam 164 substantially parallel to deflected beam 154 and propagating toward base mirror 148. Base mirror 148 reflects deflected beam 164 and generates an image beam 166 substantially parallel to image beam 156. Deflected beams 153, 163, 154, and 164, and image beams 155, 165, 156, and 166 are also referred to as reflected beams.

Camera 46 receives image beams 155, 165, 156, and 166. Image beams 155 and 165 form two images of sets of leads 43 in camera 46. The image formed by image beam 155 has a different angle of view from that formed by image beam 165. Sometimes, the images formed by image beams 155 and 165 are referred to as a shallow view image and a steep view image, respectively, of sets of leads 43. Image beams 156 and 166 form two images of sets of leads 44 in camera 46. The image formed by image beam 156 has a different angle of view from that formed by image beam 166. Sometimes, the image formed by image beams 156 and 166 are referred to as a shallow view image and a steep view image, respectively, of sets of leads 44.

Light beams emitted by light sources 51 and 52 in directions different from those of incident beams 151, 161, 152, and 162 are either blocked by some light blocking elements (not shown) of apparatus 140 or deflected by mirrors 141, 142, 143, 144, 147, and 148 into directions different from that of image beams 155, 165, 156, and 166. Therefore, those light beams do not reach camera 46 and do not affect the images therein.

Using the four images formed in camera 46, vision computer 48 reconstructs stereoscopic images of sets of leads 43 and 44. Further, vision computer 48 measures the lead parameters, e.g., lead tip position, lead coplanarity, lead length, lead straightness, lead pitch, etc., of sets of leads 43 and 44. If either set of leads 43 or 44 does not meet a predetermined design specification, semiconductor device 41 is rejected.

It should be understood that the structure of apparatus 140 is not limited to that described hereinbefore. For example, if apparatus 140 is used to inspect the leads on only one side of a device body, apparatus 140 only needs one light source, e.g., light source 51, and three mirrors, e.g., mirrors 141, 143, and 147. Even if a packaged device, e.g., device 41, has leads on more than one side of its body, an apparatus having only one light source, e.g., light source 51, and three mirrors, e.g., mirrors 141 and 143, and 147, can be used to inspect all leads of the package device by inspecting different sides of the device sequentially. LEDs 53 and 54 can be replaced by any kind of light emitting devices such as, for example, light bulbs. Each of light sources 51 and 52 can be replaced by any kind of device that generates at least two light beams having slightly different directions from each other. In addition, with respect to plane 145, mirrors 141 and 142 are not limited to being symmetric to each other, and mirrors 143 and 144 are not limited to being symmetric to each other. As long as deflected beams 153 and 163 are substantially parallel to each other and deflected beams 154 and 164 are substantially parallel to each other, base mirrors 147 and 148 can generate image beams 155, 165, 156, and 166 substantially parallel to each other and the stereoscopic images of sets of leads 43 and 44 can be formed in a single camera, e.g., camera 46.

By now it should be appreciated that a method and an apparatus for generating a stereoscopic image have been provided. The method and apparatus of the present invention provide a stereoscopic image of a work piece by back lighting the work piece using two incident light beams unparallel to each other, and deflecting the two incident light beams to generate two deflected light beams substantially parallel to each other. The deflected beams form two images of the work piece with different angles of view. In accordance with the present invention, the images of the work piece with different angles of views are generated simultaneously and can be received by a single camera, which reconstruct the stereoscopic image of the work piece. Therefore, the method is time efficient. In one embodiment, the apparatus includes a prism. In another embodiment, the apparatus includes a plurality of mirrors. Compared with prior art, the apparatus of the present invention is simple, small, and inexpensive. In addition, the method and the apparatus of the present invention are compatible with existing equipment and inspection process.

While specific embodiments of the present invention have been shown and described, further modifications and improvements will occur to those skilled in the art. It is understood that the present invention is not limited to the particular forms shown and it is intended for the appended claims to cover all modifications of the invention which fall within the true spirit and scope of the present invention. For example, the two end surfaces of the prism are not limited to being parallel to each other. In addition, the mirrors are not limited to being rectangular. They can have any shape, e.g., square, triangular, circular, elliptical, etc.

We claim:

1. A method for generating a stereoscopic image of an object, comprising the steps of:
   illuminating a first portion of the object using a first beam and a second beam;
   generating a first deflected beam by deflecting the first beam by a first angle; and
   generating a second deflected beam substantially parallel to the first deflected beam by deflecting the second beam by a second angle, the second angle being different from the first angle.

2. The method as claimed in claim 1, wherein the step of illuminating a first portion of the object includes using a diffusive light source to back light the first portion of the object.

3. The method as claimed in claim 1, further comprising the steps of:
   illuminating a second portion of the object using a third beam and a fourth beam;
   generating a third deflected beam by deflecting the third beam by a third angle; and
   generating a fourth deflected beam substantially parallel to the third deflected beam by deflecting the fourth beam by a fourth angle, the fourth angle being different from the third angle.

4. The method as claimed in claim 3, wherein the step of generating a third deflected beam further includes generating the third deflected beam substantially parallel to the first deflected beam.

5. The method as claimed in claim 1, wherein the steps of generating a first deflected beam and generating a second deflected beam include the steps of:
   transmitting the first beam and the second beam toward a first refractive surface of a prism;
   refracting the first beam at the first refractive surface of the prism to generate a first refracted beam in the prism and propagating toward a second refractive surface of the prism;
   refracting the second beam at the first refractive surface of the prism to generate a second refracted beam in the prism and propagating toward a first reflective surface of the prism;
   reflecting the first refracted beam on the second refractive surface of the prism to generate the first deflected beam; and
   reflecting the second refracted beam on the first reflective surface of the prism to generate the second deflected beam.

6. The method as claimed in claim 5, further comprising the steps of:
   illuminating a second portion of the object using a third beam and a fourth beam;
   transmitting the third beam and the fourth beam toward the second refractive surface of the prism;
   refracting the third beam at the second refractive surface of the prism to generate a third refracted beam in the prism and propagating toward the first refractive surface of the prism;
   refracting the fourth beam at the second refractive surface of the prism to generate a fourth refracted beam in the prism and propagating toward a second reflective surface of the prism;
   reflecting the third refracted beam on the first refractive surface of the prism to generate a third deflected beam substantially parallel to the first deflected beam;
   reflecting the fourth refracted beam on the second reflective surface of the prism to generate a fourth deflected beam substantially parallel to the third deflected beam; and
   transmitting the first deflected beam, the second deflected beam, the third deflected beam, and the fourth deflected beam out of the prism.

7. The method as claimed in claim 1, wherein:
   the step of generating a first deflected beam includes the step of reflecting the first beam on a first reflective surface; and
   the step of generating a second deflected beam includes the step of reflecting the second beam on a second reflective surface.

8. The method as claimed in claim 7, further comprising the steps of:
   generating a first reflected beam by reflecting the first deflected beam on a base reflector; and
   generating a second reflected beam by reflecting the second deflected beam on the base reflector.

9. The method as claimed in claim 7, further comprising the steps of:
   illuminating a second portion of the object using a third beam and a fourth beam;
   reflecting the third beam on a third reflective surface to generate a third deflected beam; and
   reflecting the fourth beam on a fourth reflective surface to generate a fourth deflected beam substantially parallel to the third deflected beam.

10. The method as claimed in claim 9, further comprising the steps of:
    generating a first reflected beam by reflecting the first deflected beam on a first base reflector;
    generating a second reflected beam by reflecting the second deflected beam on the first base reflector;
    generating a third reflected beam substantially parallel to the first reflected beam by reflecting the third deflected beam on a second base reflector; and
    generating a fourth reflected beam by reflecting the fourth deflected beam on the second base reflector.

11. An optical prism, comprising:

a base;

a first inclined surface;

a second inclined surface, wherein said second inclined surface and said first inclined surface define a ridge of the optical prism therebetween and substantially parallel to said base;

a first slope between said first inclined surface and said base, wherein said first slope and said first inclined surface intersect each other and define a first edge of the optical prism; and a second slope between said second inclined surface and said base, wherein said second slope and said second inclined surface intersect each other and define a second edge of the optical prism.

12. The optical prism of claim 11, wherein:

said first slope and said base intersect each other and define a third edge of the optical prism;

said second slope and said base intersect each other and define a fourth edge of the optical prism;

the ridge, the first edge, the second edge, the third edge, and the fourth edge of the optical prism are substantially parallel to each other; and said first inclined surface, said second inclined surface, said first slope, said second slope, and said base form a pentagon that is substantially symmetric and has a first internal angle defined by said first inclined surface and said second inclined surface at the ridge, a second internal angle defined by said first inclined surface and said first slope at the first edge, a third internal angle defined by said second inclined surface and said second slope at the second edge and substantially equal to the second internal angle, a fourth internal angle defined by said first slope and said base at the third edge, and a fifth internal angle defined by said second slope and said base at the fourth edge and substantially equal to the fourth internal angle.

13. The optical prism of claim 12, wherein:

the first internal angle is approximately 66 degrees (°);

the second internal angle and the third internal angle are approximately 169°; and the fourth internal angle and the fifth internal angle are approximately 68°.

14. The optical prism of claim 11, further comprising:

a first side between said first slope and said base and substantially perpendicular to said base, wherein said first side defines a third edge and a fourth edge of the optical prism with said first slope and said base, respectively; and a second side between said second slope and said base and substantially perpendicular to said base, wherein said second side defines a fifth edge and a sixth edge of the optical prism with said second slope and said base, respectively.

15. The optical prism of claim 14, wherein:

the ridge, the first edge, the second edge, the third edge, the fourth edge, the fifth edge, and the sixth edge of the optical prism are substantially parallel to each other; and said first inclined surface, said second inclined surface, said first slope, said second slope, said first side, said second side, and said base form a substantially symmetric heptagon.

16. A stereoscopic image apparatus, comprising:

a first reflective surface, said first reflective surface generating a first reflected beam in a first reflected direction when illuminated by a first beam in a first incident direction; and a second reflective surface adjacent said first reflective surface, said second reflective surface generating a second reflected beam in a second reflected direction substantially parallel to the first reflected direction when illuminated by a second beam in a second incident direction different from the first incident direction.

17. The stereoscopic image apparatus of claim 16, further comprising a base reflector, said base reflector generating a first image beam and a second image beam when illuminated by the first reflected beam and the second reflected beam, respectively.

18. The stereoscopic image apparatus of claim 16, further comprising:

a third reflective surface opposite to said first reflective surface, said third reflective surface generating a third reflected beam in a third reflected direction when illuminated by a third beam in a third incident direction; and a fourth reflective surface opposite to said second reflective surface and adjacent said third reflective surface, said fourth reflective surface generating a fourth reflected beam in a fourth reflected direction substantially parallel to the third reflected direction when illuminated by a fourth beam in a fourth incident direction different from the third incident direction.

19. The stereoscopic image apparatus of claim 18, further comprising:

a first base reflector, said first base reflector generating a first image beam and a second image beam when illuminated by the first reflected beam and the second reflected beam, respectively; and a second base reflector adjacent said first base reflector, said second base reflector generating a third image beam and a fourth image beam when illuminated by the third reflected beam and the fourth reflected beam, respectively, the third image beam being substantially parallel to the first image beam.

20. The stereoscopic image apparatus of claim 18, further comprising:

a first light source opposite to said first reflective surface and said second reflective surface, said first light source generating the first beam and the second beam; and a second light source opposite to said third reflective surface and said fourth reflective surface, said second light source generating the third beam and the fourth beam.

* * * * *